(12) United States Patent
Hsu et al.

(10) Patent No.: US 11,307,454 B2
(45) Date of Patent: Apr. 19, 2022

(54) ELECTRONIC DEVICE

(71) Applicant: InnoLux Corporation, Miao-Li County (TW)

(72) Inventors: Shan-Shan Hsu, Miao-Li County (TW); Ming-Tsang Wu, Miao-Li County (TW); Chia-Chieh Fan, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 17/010,186

(22) Filed: Sep. 2, 2020

(65) Prior Publication Data

US 2021/0096424 A1 Apr. 1, 2021

(30) Foreign Application Priority Data

Sep. 29, 2019 (CN) .......................... 201910932423.X

(51) Int. Cl.
*G02F 1/13357* (2006.01)
*H05K 1/18* (2006.01)
*G02F 1/1335* (2006.01)

(52) U.S. Cl.
CPC .. *G02F 1/133603* (2013.01); *G02F 1/133528* (2013.01); *H05K 1/189* (2013.01); *G02F 2202/28* (2013.01); *H05K 2201/10136* (2013.01)

(58) Field of Classification Search
CPC .......... G02F 1/133317; G02F 1/13452; G02F 1/133528; G02F 1/133311; G02F 1/133603; G02F 2202/28; G02F 2201/36; G02F 1/133615; G02F 1/133604; G02F 1/1336; G02F 1/133616; G02F 1/1335; G02F 1/13357; H05K 1/189; H05K 1/028; H05K 2201/10136; H05K 1/18
See application file for complete search history.

(56) References Cited

U.S. PATENT DOCUMENTS

| 2013/0027857 | A1* | 1/2013 | Jeong ................. G02F 1/133528 |
| | | | 361/679.01 |
| 2014/0125902 | A1* | 5/2014 | Lee .................... G02F 1/133308 |
| | | | 349/43 |
| 2017/0038515 | A1* | 2/2017 | Yuki ..................... G02B 6/0038 |
| 2017/0139119 | A1* | 5/2017 | Zhang ............... G02F 1/133512 |
| 2018/0307082 | A1 | 10/2018 | Chien |

FOREIGN PATENT DOCUMENTS

| CN | 204833232 U | 12/2015 |
| CN | 204883111 U | 12/2015 |
| CN | 106647009 A | 5/2017 |

* cited by examiner

*Primary Examiner* — Bao Q Truong
(74) *Attorney, Agent, or Firm* — McClure, Qualey & Rodack, LLP

(57) ABSTRACT

An electronic device is provided. The electronic device includes a backlight module, a display panel, an adhesive layer, and a flexible circuit board. The display panel is disposed on the backlight module. The adhesive layer is disposed between the backlight module and the display panel. The adhesive layer includes an opening. The flexible circuit board is electrically connected to the display panel. The flexible circuit board overlaps the opening.

19 Claims, 7 Drawing Sheets

US 11,307,454 B2

ELECTRONIC DEVICE

CROSS REFERENCE TO RELATED APPLICATIONS

This application claims priority of China Patent Application No. 201910932423.X, filed on Sep. 29, 2019, the entirety of which is incorporated by reference herein.

BACKGROUND OF THE INVENTION

Field of the Invention

The present disclosure relates to an electronic device, and, in particular, to an electronic device including a display panel and a backlight module.

Description of the Related Art

Electronic devices including a display panel become indispensable necessities of modern society. With the rapid development of electronic products, consumers have higher expectations for the quality, functionality and price of these products.

The display panels are widely applied in various spaces and environments. Requirement for the display qualities has attracting attention. However, the electronic devices including the display panel are not satisfactory in all aspects, so industries work on improving efficiency of the electronic device.

BRIEF SUMMARY OF THE INVENTION

The present disclosure relates to an electronic device. In one embodiment, a backlight module and a display panel of the electronic device are connected to each other by an adhesive layer. An opening in the adhesive layer may provide good air convection or circulation. Furthermore, overlapping the opening in the adhesive layer with a flexible circuit board may reduce the adverse effect on the film caused by condensed water vapor, reduce the light leakage on the device side, and/or reduce the possibility of dust entering into the backlight module, thereby maintaining the high quality of the electronic device and/or presenting a good display effect.

According to some embodiments of the disclosure, an electronic device is provided. The electronic device includes a backlight module, a display panel, an adhesive layer, and a flexible circuit board. The display panel is disposed on the backlight module. The adhesive layer is disposed between the backlight module and the display panel. The adhesive layer includes an opening. The flexible circuit board is electrically connected to the display panel, and the flexible circuit board overlaps the opening.

In order to make the features and advantages of the present disclosure more comprehensible, some embodiments are listed below and described in detail with the accompanying drawings as follows.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
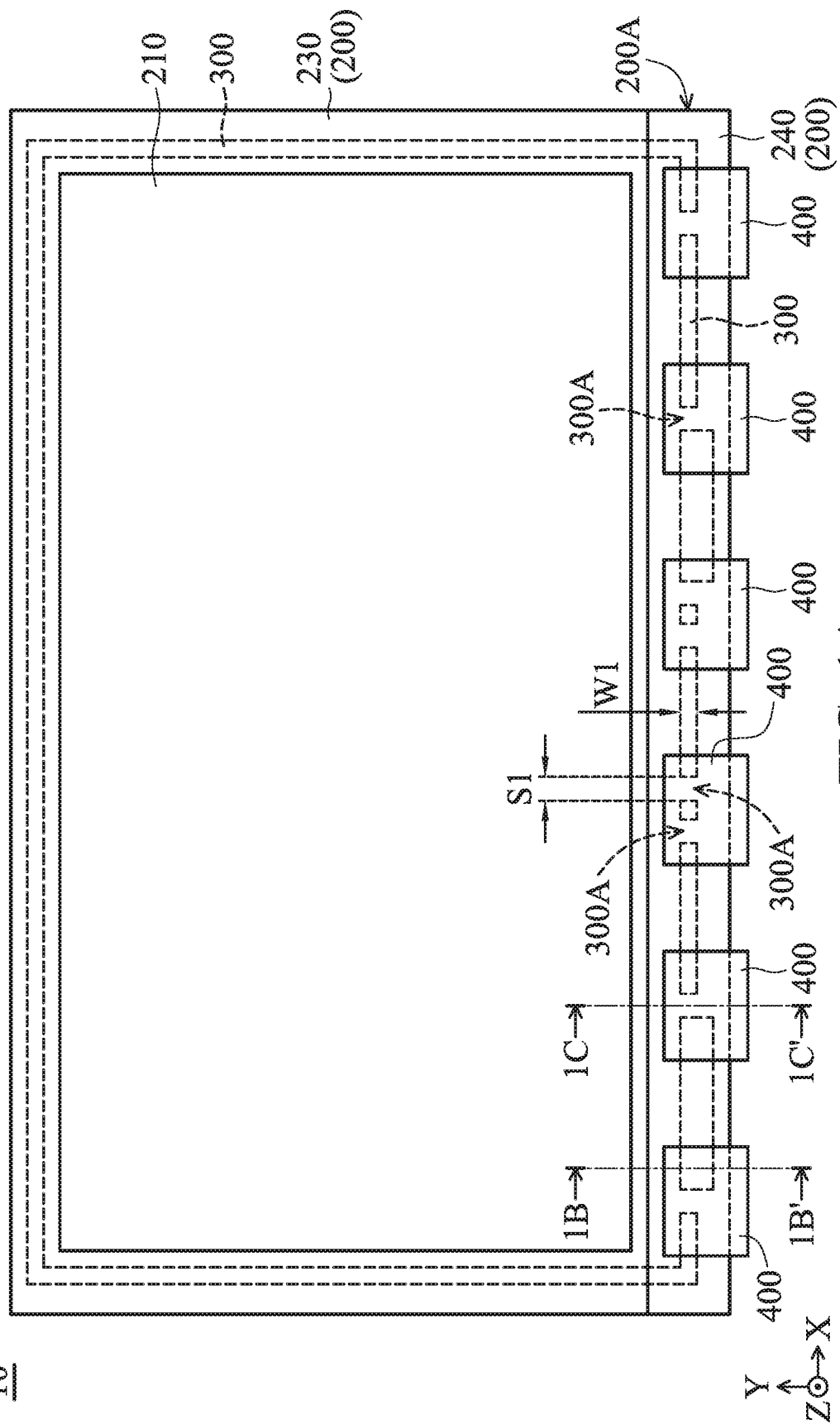
FIG. 1A illustrates a schematic top structure view of an electronic device according to some embodiments of the present disclosure.

The electronic device provided by the embodiments of the disclosure will be described in detail in the following description. It should be understood that, in the following description, various embodiments and examples are provided in order to implement the different aspects of some embodiments of the present disclosure. The specific elements and arrangements described in the following description are set forth in order to describe some embodiments of the present disclosure in a clear and easy manner. Of course, these are only used as examples but not as limitations of the present disclosure. In addition, like and/or corresponding numerals may be used in different embodiments to denote like and/or corresponding elements in order to clearly describe the present disclosure. However, the use of like and/or corresponding numerals are merely for the purpose of simplicity and clarity of the description of some embodiments of the present disclosure, and are not intended to suggest any correlation between different embodiments and/or structures discussed.

It should be understood that the elements or devices in the drawings may be present in any form known to those with ordinary skill in the art. In addition, relative terms such as "lower" or "bottom" or "higher" or "top" may be used in the embodiments to describe the relative relationship of one element of the drawing to another. It may be understood that if the device in the drawing is flipped upside down, the element described on the "lower" side will become the element on the "higher" side. The embodiments of the present disclosure can be understood in conjunction with the drawings, and the drawings of the present disclosure are also considered as part of the disclosure. It should be understood that the drawings of the present disclosure are not drawn to scale. In fact, the size of the elements may be arbitrarily enlarged or reduced in order to clearly present the features of the present disclosure.

Furthermore, the elements or devices in the drawings of the present disclosure may be present in various forms known to those with ordinary skill in the art. In addition, it should be understood that, although the terms "first", "second", "third" etc. are used herein to describe various elements, components, or parts, these elements, components, or parts should not be limited by these terms. These terms are only used to distinguish one elements, components, regions, layers, or parts from other elements, components, regions, layers, or parts. Thus, a first element, component, region, layer, or part discussed below could be termed as a second element, component, region, layer, or part without departing from the teachings of the present disclosure.

Here, the terms "about", "approximately", "substantially" usually means within 20%, within 10%, within 5%, within 3%, within 2%, within 1% or within 0.5% of a given value or range. Here, the given value is an approximate number. That is, in the absence of a specific description of "about", "approximately", "substantially", the meaning of "about", "approximately", "substantially" may still be implied. Besides, the term "ranging from a first value to a second value", "in a range from a first value to a second value" indicate that the said range includes the first value, the second value and the values in between.

In some embodiments of the present disclosure, the terms for connection or conjugation, such as "connect", 'interconnect' etc. indicate that the two structures may be in direct contact with each other or be in direct contact with each other with other structures disposed therebetween as well, unless the context clearly indicates otherwise. The terms for connection or conjugation may also indicate the conditions in which the two structures are both movable and the two structures are both fixed.

Unless defined otherwise, all technical and scientific terms used herein have the same meaning as commonly understood by one of ordinary skills in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined. For example, without specific defined, the term size may indicate area, length, width or thickness, but not limited thereto.

Figure 1B:
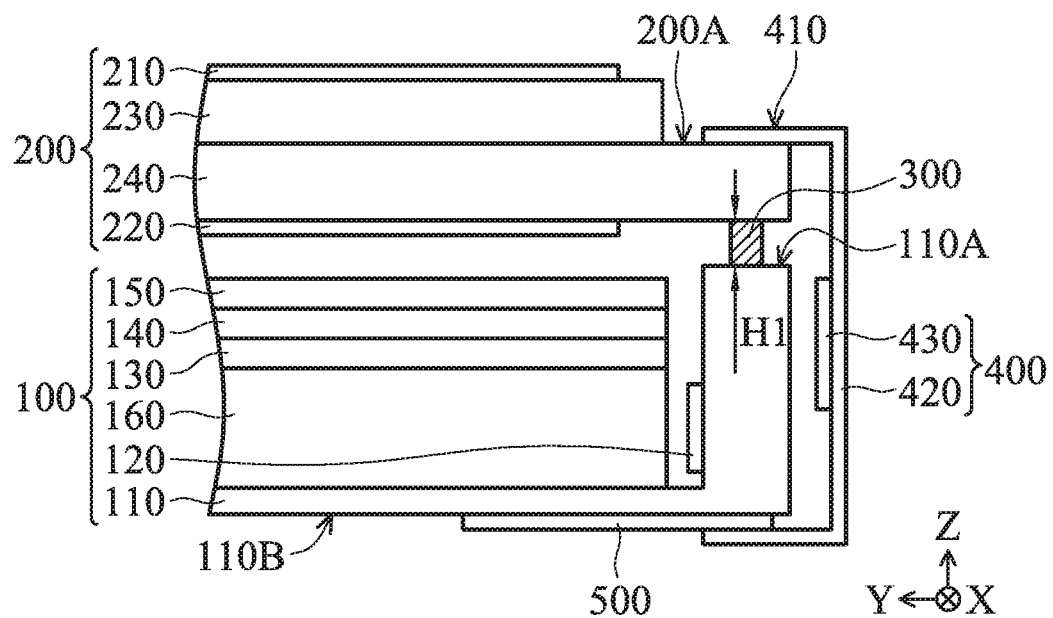
FIG. 1B illustrates a schematic cross-sectional structure view taken along a line 1B-1B' in FIG. 1A according to some embodiments of the present disclosure.
Figure 1C:
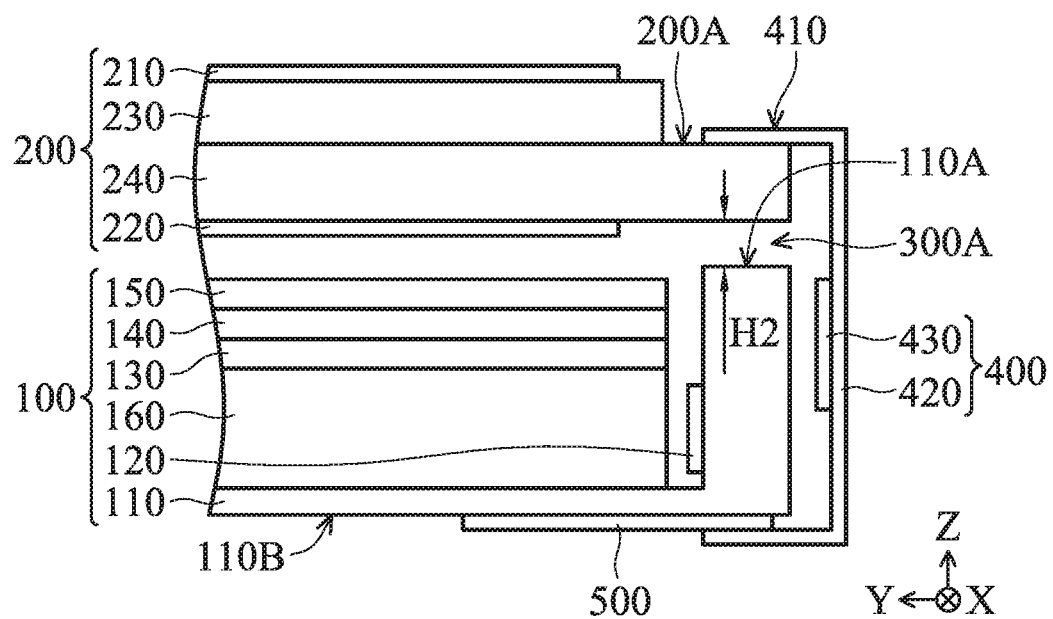
FIG. 1C illustrates a schematic cross-sectional structure view taken along a line 1C-1C' in FIG. 1A according to some embodiments of the present disclosure.

FIG. 1A illustrates a schematic top structure view of an electronic device according to some embodiments of the present disclosure; FIG. 1B illustrates a schematic cross-sectional structure view taken along a line 1B-1B' in FIG. 1A according to some embodiments of the present disclosure; and FIG. 1C illustrates a schematic cross-sectional structure view taken along a line 1C-1C' in FIG. 1A according to some embodiments of the present disclosure. It should be understood that, in order to clearly describe the present disclosure, FIGS. 1A-1C only show some elements of the electronic device 10. In addition, according to some embodiments, additional features may be added to the electronic device described below.

In the embodiment, as shown in FIGS. 1A-1C, the electronic device 10 includes a backlight module 100, a display panel 200, an adhesive layer 300, and a flexible circuit board 400. The display panel 200 is disposed on the backlight module 100. The adhesive layer 300 is disposed between the backlight module 100 and the display panel 200, and includes an opening 300A. The flexible circuit board 400 is electrically connected to the display panel 200 and overlaps the opening 300A in the adhesive layer 300. In particular, in some embodiments, the flexible circuit board 400 overlaps the opening 300A in the adhesive layer 300 indicates that the flexible circuit board 400 overlaps the opening 300A in the adhesive layer 300 in the Y direction (the side view direction), or the flexible circuit board 400 overlaps the opening 300A in the adhesive layer 300 in the Z direction (the top view direction).

In the embodiments of the present disclosure, as shown in FIGS. 1A-1C, the backlight module 100 and the display panel 200 are connected to each other by the adhesive layer 300. The opening 300A in the adhesive layer 300 may provide good air convection or circulation, thereby reducing the adverse effect caused by water vapor condensing inside the interior of the electronic device 10. In some embodiments, the flexible circuit board 400 is electrically connected to the display panel 200. The flexible circuit board 400 is corresponding to the disposition of the adhesive layer 300 to overlap the opening 300A in the adhesive layer 300. In some embodiment, the flexible circuit board 400 is bent to a side of the backlight module 100 which is away from the display panel 200 and is disposed at a side of the display panel 200 which is adjacent to the opening 300A, so that the possibility of light leaking from the interior of the electronic device 10 (e.g. the light from the backlight module 100) through the opening 300A could be reduced. Therefore, according to the embodiments of the disclosure, by overlapping the opening 300A in the adhesive layer 300 with a flexible circuit board 400, the adverse effect on the film caused by condensed water vapor, the light leakage on the device side, and/or the possibility of dust entering into the backlight module could be reduced, so that the high quality of the electronic device could be maintained and/or a good display effect could be presented.

According to some embodiments of the disclosure, the flexible circuit board 400 is an inherent, necessary element of the electronic device 10. By overlapping the opening 300A in the adhesive layer 300 with the flexible circuit board 400, an additional light block element or a tortuous wind path may be omitted. Therefore, the possibility of water vapor condensation or the light leakage on the device side could be reduced, and/or it is beneficial to apply the electronic device to a Narrow Bezel design or a Bezel-less design.

In some embodiments, as shown in FIG. 1A, segments of the adhesive layer 300 have, for example, straight line shapes extending in the X direction and the Y direction. In some embodiments, as shown in FIG. 1A, wire widths W1 of the segments of the adhesive layer 300 may be the same as or different from each other. In some embodiments, the segments of the adhesive layer 300 may extend along a direction different from X direction and Y direction, for example, the angle between the extending direction and X direction may be less than 45° (not shown) and/or the angle between the extending direction and Y direction may be less than 45° (not shown). In some embodiments, the adhesive layer segment of the adhesive layer 300 may have a bent portion (not shown). In some embodiments, an end or the bent portion of the adhesive layer segment of the adhesive layer 300 may have, for example, an arc-structure (not shown) caused by an automatic dispenser process, but not limited thereto.

In some embodiments, as shown in FIG. 1A, the width S1 of the opening 300A in the adhesive layer 300 is, for example, in a range from 0.1 mm to 5 m (0.1 mm≤S1≤5 mm). In some embodiments, the width S1 along X direction of the opening 300A is, for example, in a range from 1 mm to 4 mm (1 mm≤S1≤4 mm). In some embodiments, the width S1 of the opening 300A is, for example, in a range from 1 mm to 2 mm (1 mm≤S1≤2 mm). In particular, as shown in FIG. 1A, the opening 300A in the adhesive layer 300 may define a region between two adjacent segments of the adhesive layer 300, and the width S1 of the opening 300A in the adhesive layer 300 may be defined as the minimum distance between the two adjacent segments of the adhesive layer 300. According to some embodiments, the opening 300A may have an irregular shape, such as a curved shape, a S-shape, a L-shape or a stepped shape, but not limited thereto. According to some embodiments, when the width S1 of the opening 300A in the adhesive layer 300 is smaller than 0.1 mm, the possibility of water vapor condensation may be increased; and when the width S1 of the opening 300A in the adhesive layer 300 is larger than 5 mm, the possibility of dust entering into the interior of the device may be increased. Therefore, according to some embodiments of the disclosure, when the width S1 of the opening 300A in the adhesive layer 300 is between 0.5 mm and 5 mm, the water vapor condensation and the dust pollution may be reduced. In some embodiments, the irregular shape of the opening 300A may reduce light leakage.

In some embodiments, the widths S1 of the openings 300A in the adhesive layer 300 may be the same as or different from each other. The shape of the openings 300A may be the same or different to each other, but not limited thereto.

In some embodiments, as shown in FIGS. 1A-1C, the adhesive layer 300 may include a plurality of openings 300A. The flexible circuit board 400 may overlaps the openings 300A. That is, the flexible circuit board 400 overlaps the openings 300A in the Y direction (the side view direction), or the flexible circuit board 400 overlaps the openings 300A in the Z direction (the top view direction). For example, as shown in FIG. 1A, one flexible circuit board 400 may overlap two openings 300A in the adhesive layer 300. The number of openings 300A in the adhesive layer 300 overlaped by one flexible circuit board 400 could be adjusted according to needs, but not limited thereto.

In some embodiments, as shown in FIGS. 1A-1C, the electronic device 10 may include a plurality of flexible circuit boards 400, the adhesive layer 300 may include a plurality of openings 300A, and at least one of the plurality of flexible circuit boards 400 overlaps at least one of the plurality of openings 300A. For example, the number of openings 300A overlaped by one flexible circuit board 400 may be the same as or different from the number of openings 300A overlaped by another flexible circuit board 400. The number of flexible circuit boards 400, the number of openings 300A in the adhesive layer 300, the distribution of the openings 300A in the adhesive layer 300, and the number of openings 300A overlaped by the flexible circuit board 400 may be adjusted according to the actual application, but they are not limited thereto. In some embodiments, as shown in FIG. 1A, all the openings 300A in the adhesive layer 300 are overlaped by the flexible circuit boards 400. In some embodiments, some flexible circuit boards 400 may have different size. In some embodiments, as shown in FIG. 1A, the openings 300A in the adhesive layer 300 are non-uniform distributed in the adhesive layer 300, but not limited thereto.

As shown in FIGS. 1A-1C, in some embodiments, an end 410 of the flexible circuit board 400 overlaps the opening 300A in the adhesive layer 300 in a normal direction of the display panel 200 (e.g. the Z direction). In other words, the end 410 of the flexible circuit board 400 overlaps the opening 300A in the adhesive layer 300 in the Z direction. According to some embodiments of the disclosure, the end 410 is defined as the area where the flexible circuit board 400 overlaps the display panel 200 in the normal direction of the display panel 200 (e.g. the Z direction).

In some embodiments, the flexible circuit board 400 may be a Flexible Printed Circuit (FPC), a Chip on Film (COF), a tape carrier package (TCP) or other suitable flexible circuit-board connecting elements, but not limited thereto. In some embodiments, as shown in FIGS. 1B and 1C, the flexible circuit board 400 may include a flexible carrier 420 and a driving chip 430, and the driving chip 430 is disposed on the flexible carrier 420. In some embodiments, as shown in FIGS. 1B and 1C, in the Y direction, the driving chip 430 is located between the backlight module 100 and the flexible carrier 420. In some embodiments, materials of the flexible carrier 420 may include polyimide (PI), other suitable flexible carrier materials, or a combination thereof, but not limited thereto.

In some embodiments, as shown in FIGS. 1B and 1C, the backlight module 100 may include a housing 110 and a light-emitting element 120, the light-emitting element 120 is disposed on the housing 110, and the light-emitting element 120 is disposed in an accommodating space formed by the housing 110. In some embodiments, the housing 110 is, for example, a frame, but not limited thereto. In some embodiments, the light-emitting element 120 may include inorganic light-emitting diodes, such as mini light-emitting diodes (mini LED), micro light-emitting diodes (micro LED), organic light-emitting diodes (OLED), electroluminescence, quantum dot (QD) materials, quantum dot light-emitting diodes (QDLED or QLED), fluorescence materials, phosphor materials, other suitable materials, or a combination thereof, but not limited thereto. In some embodiments, as shown in FIGS. 1B and 1C, the backlight module 100 may further include a light guide plate 160. The light-emitting element 120 is disposed adjacent to the light guide plate 160, and the light-emitting element 120 may contact with at least one side of the housing 110. The heat dissipation effect of the light-emitting element 120 may be improved by the housing 110. The above configuration is exemplary only, and the disclosure is not limited thereto.

In some embodiments, the backlight module 100 may further included at least one optical film, for example, as shown in FIGS. 1B and 1C, the backlight module 100 may further include an optical film 130, an optical film 140 and/or an optical film 150. In some embodiments, the optical film 130, the optical film 140 and/or the optical film 150 may be a prism, a brightness enhancement film (BEF), a diffuser, a reflector, a QD film, other suitable elements, or a combination thereof, but not limited thereto.

In some embodiments, as shown in FIG. 1B, the adhesive layer 300 is, for example, in direct contact with the housing 110 and the display panel 200. In particular, in some embodiments, the adhesive layer 300 is in direct contact with a top surface 110A of the housing 110 and the display panel 200. In some embodiments, the height H1 of the adhesive layer 300 is defined as the maximum height in the Z direction from the top surface 110A to the display panel 200. The height H1 is, for example, in a range from 150 μm to 500 μm (150 μm≤H1≤500 μm), or in a range from 200 μm to 400 μm (200 μm≤H1≤400 μm), or in a range from 250 μm to 300 μm (250 μm≤H1≤300 μm), but not limited thereto.

In some embodiments, as shown in FIG. 1A, the wire width W1 of the adhesive layer 300 is, for example, in a range from 0.1 mm to 10 mm (0.1 mm≤W1≤10 mm), or in a range from 0.5 mm to 5 mm (0.5 mm≤W1≤5 mm), or in a range from 1 mm to 3 mm (1 mm≤W1≤3 mm), but not limited thereto. The wire width W1 of the adhesive layer 300, as used herein, indicates the maximum width of the adhesive layer 300 in a direction perpendicular to the extending direction of the adhesive layer 300. For example, when the adhesive layer 300 extends in the X direction, the width of the adhesive layer 300 indicates the maximum width of the adhesive layer 300 in the Y direction. In some embodiments, the wire width of one adhesive layer segment of the adhesive layer 300 indicates the maximum width of the adhesive layer segment of the adhesive layer 300 in a direction perpendicular to the extending direction of the adhesive layer segment.

In some embodiments, as shown in FIG. 1C, the opening 300A in the adhesive layer 300 is located between the housing 110 and the display panel 200 in the Z direction. In particular, in some embodiments, the opening 300A in the adhesive layer 300 exposes the top surface 110A of the housing 110. In some embodiments, the height H2 of the opening 300A in the adhesive layer 300 is defined as the maximum height in the Z direction from the top surface 110A to the display panel 200. The height H2 is, for example, in a range from 150 μm to 500 μm (150 μm≤H2≤500 μm), or in a range from 200 μm to 400 μm (200 μm≤H2≤400 μm), or in a range from 250 μm to 300 μm (250 μm≤H2≤300 μm), but not limited thereto. In some embodiments, the height H1 of the adhesive layer 300 and the height H2 of the opening 300A in the adhesive layer 300 may be the same or different. When the height H2 is smaller than 150 μm, the possibility of water vapor condensation may be increased, and when the height H2 is larger than 500 μm, the possibility of dust entering into the interior of the device may be increased, and/or the amount of the adhesive layer 300 that is usable may be increased, and the cost may be increased. Therefore, according to some embodiments of the disclosure, when the height H2 of the opening 300A in the adhesive layer 300 is between 150 μm and 500 μm, the water vapor condensation and the dust pollution may be reduced.

In some embodiments, the adhesive layer 300 may include a UV cured glue layer (e.g. UV cured pressure sensitive adhesives), a moisture cured glue layer, a double sided glue tape, other suitable adhesive materials or elements, or a combination thereof, but not limited thereto.

In some embodiments, the adhesive layer 300 includes, for example, a UV cured glue layer and/or a moisture cured glue layer formed by a coating process. The coating process may form an adhesive layer 300 with a smaller wire width W1, so the area occupied by a bezel structure could be reduced, thereby achieving a narrow bezel effect or a bezel less effect. Furthermore, in some embodiments, the UV cured glue layer and/or the moisture cured glue layer may be completed by one dispensing process, so the manufacturing process of electronic device 10 may be simplified.

In some embodiments, the adhesive layer 300 includes a UV cured glue layer and/or a moisture cured glue layer formed by a coating process. The glue with different height may be formed in different areas by controlling the conditions of the coating process. Therefore, when the backlight module 100 and the display panel 200 have different surface structures, separation distances between junctions of the backlight module 100 and the display panel 200 are different in different regions, the adhesive layer 300 may have different heights in different regions to improve the adhesion between the backlight module 100 and the display panel 200, so that to improve the adhesion strength and/or device reliability.

In some embodiments, the adhesive layer 300 may include a double sided glue tape, such as double-sided foam glue tape. The double sided glue tape with high viscosity could quickly connect the backlight module 100 and the display panel 200, and provide advantages of fast process and/or strong adhesion.

In some embodiments, the adhesive layer 300 may include materials with light blocking properties. For example, the adhesive layer 300 may include materials with low transmittance (e.g. less than 30%). In some embodiments, the materials of the adhesive layer 300 may include ink, organic resins, organic pigments, inorganic pigments, other suitable materials, or a combination thereof, but not limited thereto. According to some embodiments of the disclosure, the adhesive layer 300 includes materials with light blocking properties to reduce the light leakage of the device.

According to some embodiments, the display panel 200 may be, for example, a display panel including liquid crystal. The liquid-crystal display panel may include, for example, a twisted nematic (TN) liquid-crystal display panel, a super twisted nematic (STN) liquid-crystal display panel, a double layer super twisted nematic (DSTN) liquid-crystal display panel, a vertical alignment (VA) liquid-crystal display panel, an in-plane switching (IPS) liquid-crystal display panel, a cholesteric) liquid-crystal display panel, a blue phase liquid-crystal display panel, a Fringe Field Switching (FFS) liquid-crystal display panel, other suitable liquid-crystal display panels, or a combination thereof, but not limited thereto.

In some embodiments, as shown in FIGS. 1A-1C, the display panel 200 may include a first polarizer 210, a second polarizer 220, a first substrate 230, and a second substrate 240. The first polarizer 210 and the second polarizer 220 are disposed on the first substrate 230 and the second substrate 240 respectively. The display panel 200 may further include a display medium layer, such as a liquid-crystal layer (not shown), between the first substrate 230 and the second substrate 240. It should be understood that, the structure of the display panel 200 illustrated in the drawings is an exemplary structure, some elements are omitted therefrom. According to some embodiments, additional features could be omitted from or added to the display panel 200 described below, and one of ordinary skills in the art to which the disclosure belongs could appropriately adjust the configuration of the display panel 200 according to needs.

In some embodiments, materials of the first polarizer 210 and the second polarizer 220 may include poly vinyl alcohol (PVA), other suitable materials, or a combination thereof, but not limited thereto. For example, in some embodiments, each of the first polarizer 210 and the second polarizer 220 may include two protective layers and one polyvinyl alcohol film sandwiched between the protective layers, the protective layers may be, for example, triacetyl cellulose (TAC) films. However, in other embodiments, the first polarizer 210 and/or the second polarizer 220 may be replaced with a wire grid polarizer (WGP), the wire grid polarizer can be adjusted according to the situation. In some embodiments, as shown in FIGS. 1B and 1C, the backlight module 100 is disposed adjacent to the second polarizer 220 of the display panel 200.

In some embodiments, each of the first substrate 230 and the second substrate 240 may include a first base and a second base (not shown), materials of the first base and the second base may respectively include glass materials, quartz, sapphires, polycarbonates (PC), polyimides (PI), polyethylene terephthalates (PET), liquid-crystal polymers (LCP), rubber, fiberglass, ceramic, other suitable substrate materials, or a combination thereof, but not limited thereto. In some embodiments, the glass materials may include glass materials that have undergone chemical strengthening treatment and/or ion exchange treatment, for example, a soda-lime glass, a lead glass, a borosilicate glass, a quartz glass, an aluminosilicate glass, or other suitable glass materials, but is not limited thereto.

In some embodiments, the liquid-crystal layer may include liquid-crystal molecules (not shown). In some embodiments, the displayed image can be adjusted by applying different electric fields to the liquid-crystal layer.

In some embodiments, as shown in FIG. 1C, the opening 300A in the adhesive layer 300 is located between the polarizer (e.g. the second polarizer 220) and the driving chip 430 of the flexible circuit board 400 in the Z direction. Also, the opening 300A in the adhesive layer 300 is located between the polarizer (e.g. the second polarizer 220) and the flexible carrier 420 of the flexible circuit board 400 in the Z direction. In some embodiments, the opening 300A in the adhesive layer 300 is located between the second substrate 240 and the housing 110 of the backlight module 100 in the Z direction.

In some embodiments, as shown in FIG. 1C, the end 410 of the flexible circuit board 400 is disposed in the wiring area 200A on the second substrate 240 of the display panel 200. At least a part of the wiring area 200A has a metal wiring (not shown), and at least a part of the end 410 is in contact with and electrically connected to the metal wiring of the wiring area 200A. In the Z direction, the wiring area 200A is located between the opening 300A in the adhesive layer 300 and the end 410 of the flexible circuit board 400.

Although not shown in the drawings, in some embodiments, the first substrate 230 and/or the second substrate 240 may further include elements such as a driving circuit, an electrode layer, an alignment layer or a light conversion layer disposed on the first substrate and/or the second substrate. The above-mentioned elements may exist in various forms well known to those of ordinary skill in the technical field of the present disclosure. In some embodiments, the first substrate 230 is, for example, a substrate structure including a color filter layer, and the second substrate 240 is, for example, a substrate structure including a thin film transistor, but not limited thereto.

In particular, the driving circuit may be, for example, an active driving circuit or a passive driving circuit. According to some embodiments, the driving circuit may include a transistor (e.g. a switching transistor or a driving transistor, etc.), a data line, a scanning line, a conductive pad, a dielectric layer, or other wirings, etc., but not limited thereto. The switching transistor could be used to control the switching of pixels of the display. In some embodiments, the transistor may include low-temperature polysilicon (LTPS), indium gallium zinc oxide (IGZO), amorphous silicon (a-Si), or other suitable semiconductor materials, but not limited thereto. In some embodiments, different transistors disposed in different regions may include different semiconductor materials, but not limited thereto.

The aforementioned electrode layer may be electrically connected to the driving circuit to control the electric field applied to the liquid-crystal layer. In some embodiments, the wiring area 200A may have metal wirings electrically connected to the driving circuit. In some embodiments, the electrode layer may include metal conductive materials. In some embodiments, materials of the electrode layer may include copper, silver, tin, aluminum, molybdenum, tungsten, gold, chromium, nickel, platinum, copper alloy, silver alloy, tin alloy, aluminum alloy, molybdenum alloy, tungsten alloy, gold alloy, chromium alloy, nickel alloy, platinum alloy, other suitable conductive materials, or a combination thereof, but not limited thereto.

The alignment layer may be disposed between the electrode layer and the liquid-crystal layer. The alignment layer can control the alignment direction of the liquid-crystal molecules in the liquid-crystal layer. In some embodiments, materials of the alignment layer may include polyimide (PI), or other materials with alignment functions, but not limited thereto.

Further, the light conversion layer may be disposed between the first substrate 230 and/or the second substrate 240 and the liquid-crystal layer. The light conversion layer may have a function of converting the wavelength of light, for example, a light source could be converted into a light with a specific wavelength range (specific color). In some embodiments, the light conversion layer may include a matrix and particles dispersed in the matrix. In some embodiments, materials of the matrix may include organic polymers, inorganic polymers, glass, or a combination thereof, but not limited thereto. In some embodiments, the matrix may be transparent or translucent. In some embodiments, the particles may include phosphors, quantum dot (QD) materials, organic fluorescent materials, other suitable materials, or a combination thereof, but not limited thereto.

In some other embodiments, the display medium layer in the display panel 200 may be a light-emitting layer. The light-emitting layer may include, for example, inorganic light-emitting diodes, organic light-emitting diodes, phosphor materials, other suitable light-emitting materials or elements, or a combination thereof, but not limited thereto. The inorganic light-emitting diodes (LED) may include, for example, mini light-emitting diodes (mini LED), micro light-emitting diodes (micro LED), quantum dot (QD), quantum dot light-emitting diodes (QDLED or QLED), or a combination thereof. In addition, the light-emitting diode may be a vertical type light-emitting diode or a flip-chip type light-emitting diode.

In some embodiments, as shown in FIGS. 1B and 1C, the electronic device 10 may include a driving circuit board 500, and the driving circuit board 500 is disposed adjacent to the backlight module 100. In some embodiments, as shown in FIGS. 1B and 1C, the driving circuit board 500 is disposed at the bottom 110B of the housing 110 of the backlight module 100. In some embodiments, the driving circuit board 500 may be electrically connected to the display panel 200 by flexible circuit board 400. The opening 300A in the adhesive layer 300 is located between the display panel 200 and the driving circuit board 500 in the Z direction. Moreover, the end 410 of the flexible circuit board overlaps the driving circuit board 500 in a normal direction.

In some embodiments, the driving circuit board 500 may be a printed circuit board assembly (PCBA) with multiple active elements and/or passive elements. For example, the pixels of the display panel 200 could be controlled by an integrated circuit or a microchip of the driving circuit board 500, but the present disclosure is not limited thereto.

Figure 2A:
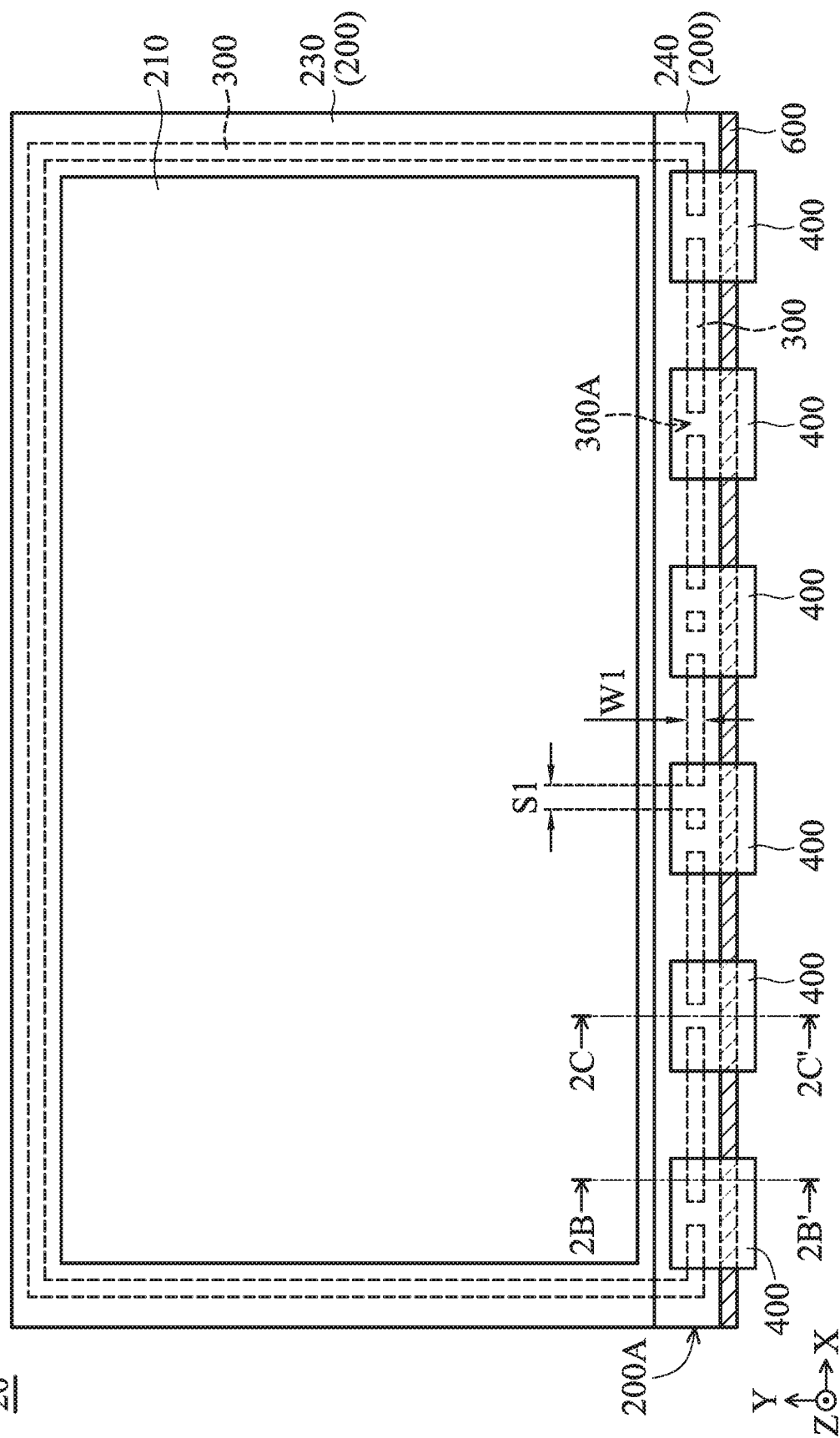
FIG. 2A illustrates a schematic top structure view of an electronic device according to some embodiments of the present disclosure.
Figure 2B:
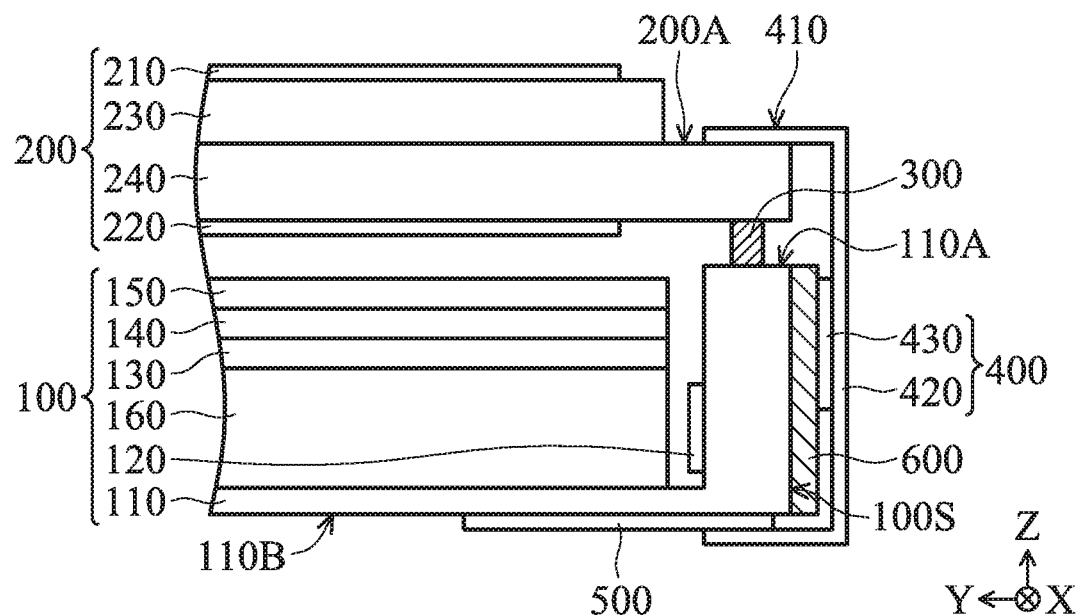
FIG. 2B illustrates a schematic cross-sectional structure view taken along the line 2B-2B' in FIG. 2A according to some embodiments of the present disclosure.
Figure 2C:
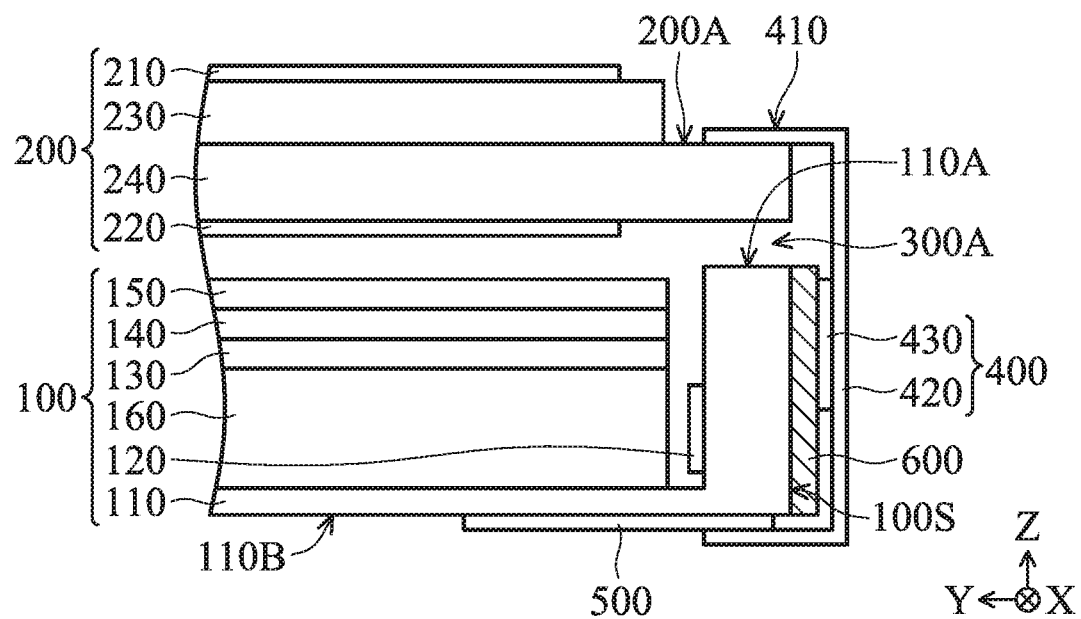
FIG. 2C illustrates a schematic cross-sectional structure view taken along the line 2C-2C' in FIG. 2A according to some embodiments of the present disclosure.

FIG. 2A illustrates a schematic top structure view of an electronic device according to some embodiments of the present disclosure; FIG. 2B illustrates a schematic cross-sectional structure view taken along the line 2B-2B' in FIG. 2A according to some embodiments of the present disclosure; and FIG. 2C illustrates a schematic cross-sectional structure view taken along the line 2C-2C' in FIG. 2A according to some embodiments of the present disclosure. In this embodiment, the elements which are the same or similar as those in the previous embodiments are marked with the same or similar numerals as those in the previous embodiments. Please refer to the foregoing for the descriptions of the same or similar elements, and thus, the repeated descriptions of the same or similar elements will be omitted.

As shown in FIGS. 2A-2C, in the embodiment, the electronic device 20 includes the backlight module 100, the display panel 200, the adhesive layer 300, and the flexible circuit board 400. The electronic device 20 may further include an insulating buffer layer 600. The insulating buffer layer 600 is disposed between a sidewall 100S of the backlight module 100 and the flexible circuit board 400 in the Y direction.

In some embodiments, as shown in FIGS. 2B and 2C, the insulating buffer layer 600 is in direct contact with the driving chip 430 of the flexible circuit board 400. In some embodiments, the driving chip 430 may be electrically isolated from the backlight module 100 by the insulating buffer layer 600. In some embodiments (not shown), the insulating buffer layer 600 is located between the housing 110 and the flexible circuit board 400, only a part of the insulating buffer layer 600 is disposed at the sidewall 100S of the housing 110, as long as it could achieve the purpose of electrically isolating the driving chip 430 from the housing 110, but not limited thereto.

In some embodiments, the insulating buffer layer 600 may be formed of insulating materials. In some embodiments, materials of the insulating buffer layer 600 may include organic materials, inorganic materials, or a combination thereof, but not limited thereto. The organic materials may include polyethylene terephthalates (PET), polyethylenes (PE), polyethersulfones (PES), polycarbonates (PC), polymethylmethacrylates (PMMA), isoprene, phenol-formaldehyde resins, benzocyclobutene (BCB), perfluorocyclobutane (PECB), other suitable organic insulating materials, or a combination thereof, but not limited thereto. The inorganic materials may include silicon nitride, silicon oxide, silicon oxynitride, other suitable inorganic insulating materials, or a combination thereof, but not limited thereto.

In some embodiments, the insulating buffer layer 600 may be a single layer structure. In other embodiments, the insulating buffer layer 600 may include a plurality of sub-layers. In the embodiments where the insulating buffer layer 600 includes multiple sub-layers, the materials of the sub-layers may be the same as or different from each other.

In some embodiments, the housing 110 of the backlight module 100 may include a metal material, for example, be made of metal. According to some embodiments of the disclosure, the insulating buffer layer 600 is disposed between the housing 110 and the driving chip 430, so that the driving chip 430 could be protected from being damaged or split by the impact of the housing 110. The insulating buffer layer 600 could provide buffering and/or protection effects for the driving chip 430.

In addition, in some embodiments, the housing 110 of the backlight module 100 may include a conductive material. The housing 110 could be grounded to discharge static electricity from the device. The driving chip 430 could be electrically isolated from the backlight module 100 by the insulating buffer layer 600. It could protect the driving chip 430 from being damaged by a sudden rise in static electricity.

Figure 3A:
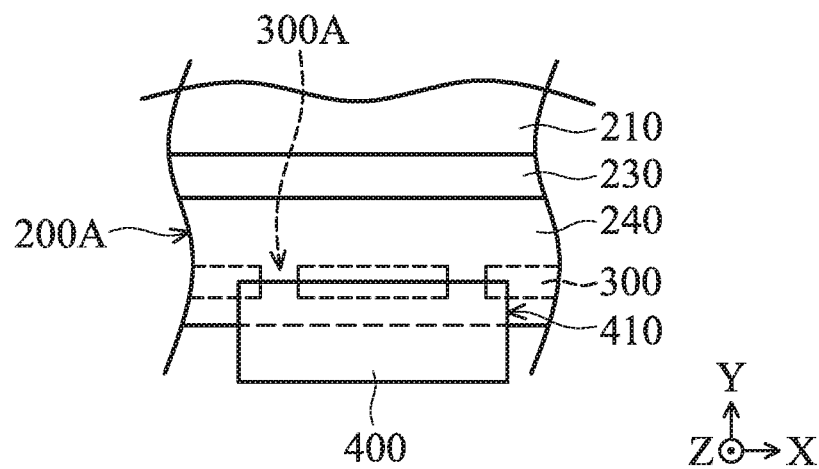
FIG. 3A illustrates a schematic partial top structure view of an electronic device according to some embodiments of the present disclosure.
Figure 3B:
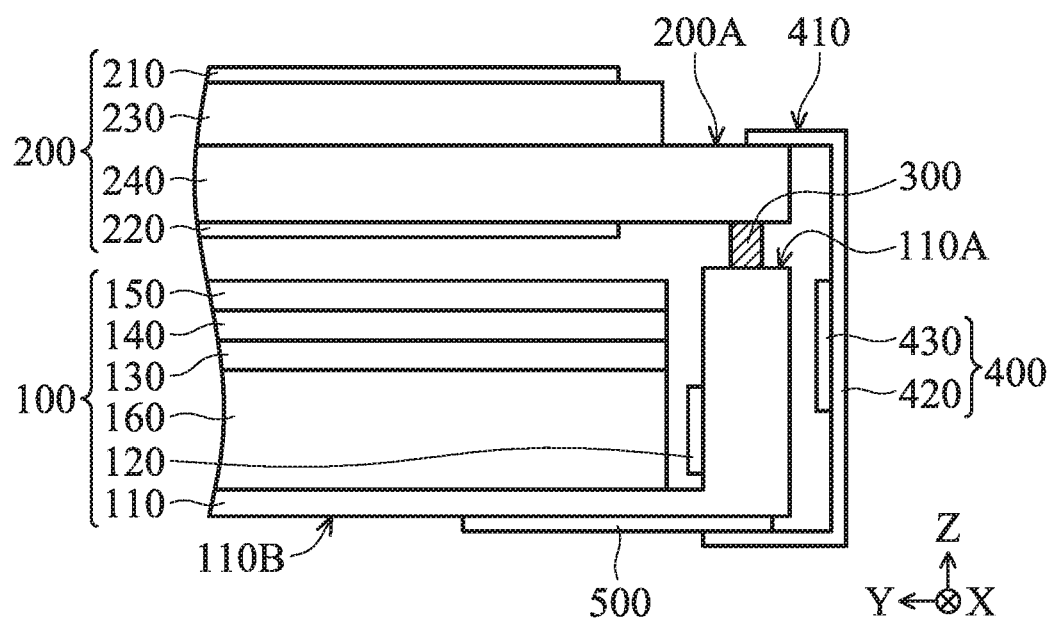
FIG. 3B illustrates a schematic partial cross-sectional structure view of the electronic device shown in FIG. 3A according to some embodiments of the disclosure.

FIG. 3A illustrates a schematic partial top structure view of an electronic device according to some embodiments of the present disclosure; and FIG. 3B illustrates a schematic partial cross-sectional structure view of the electronic device shown in FIG. 3A according to some embodiments of the disclosure. In this embodiment, the elements which are the same or similar as those in the previous embodiments are marked with the same or similar numerals as those in the previous embodiments. Please refer to the foregoing for the descriptions of the same or similar elements, and thus, the repeated descriptions of the same or similar elements will be omitted.

As shown in FIGS. 3A and 3B, in some embodiments, the end 410 of the flexible circuit board 400 partially overlaps the adhesive layer 300 in the normal direction (e.g. the Z direction) of the display panel 200.

As shown in FIG. 3A, in some embodiments, the flexible circuit board 400 (e.g. the end 410 of the flexible circuit board 400) partially overlaps the opening 300A in the adhesive layer 300 in the Z direction of the display panel 200.

Figure 4A:
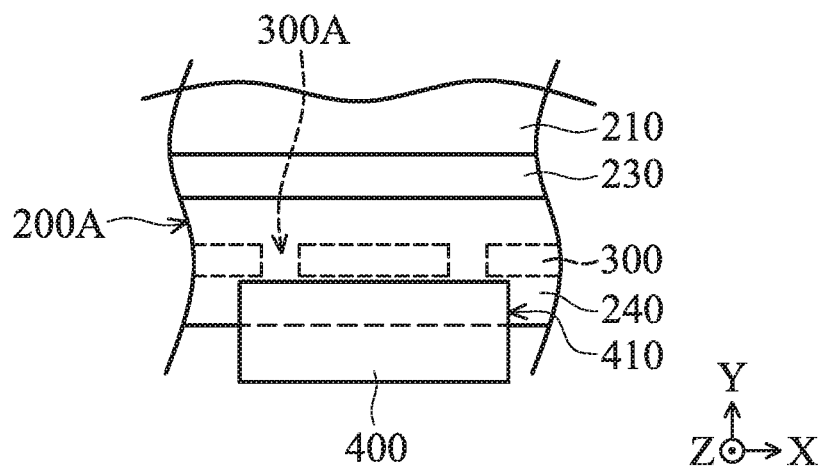
FIG. 4A illustrates a schematic partial top structure view of an electronic device according to some embodiments of the present disclosure.
Figure 4B:
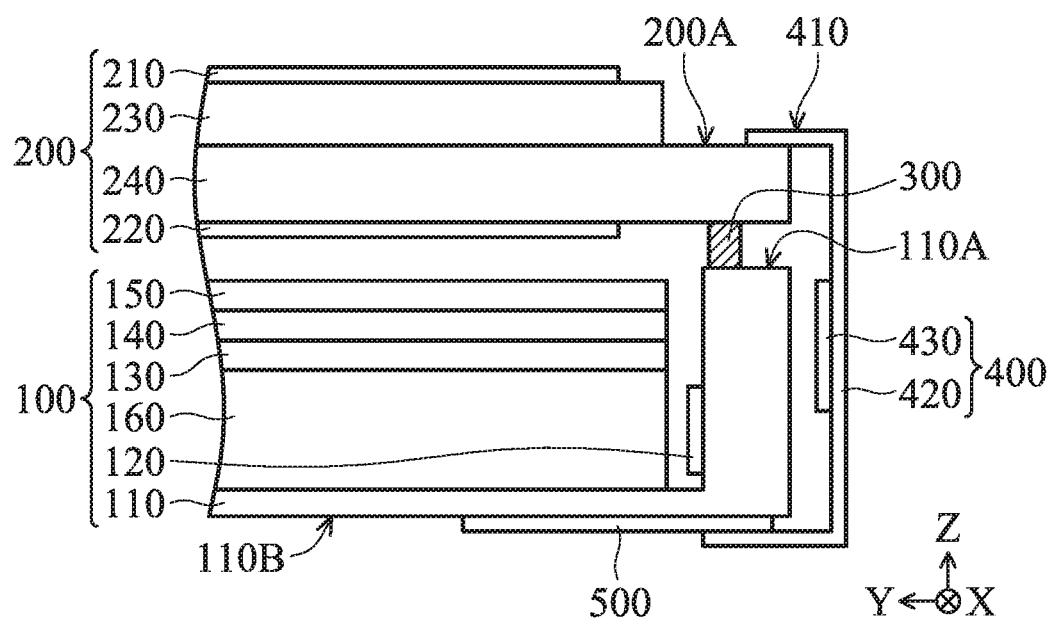
FIG. 4B illustrates a schematic partial cross-sectional structure view of the electronic device shown in FIG. 4A according to some embodiments of the disclosure.

FIG. 4A illustrates a schematic partial top structure view of an electronic device according to some embodiments of the present disclosure; and FIG. 4B illustrates a schematic partial cross-sectional structure view of the electronic device shown in FIG. 4A according to some embodiments of the disclosure. In this embodiment, the elements which are the same or similar as those in the previous embodiments are marked with the same or similar numerals as those in the previous embodiments. Please refer to the foregoing for the descriptions of the same or similar elements, and thus, the repeated descriptions of the same or similar elements will be omitted.

As shown in FIGS. 4A and 4B, in some embodiments, the end 410 of the flexible circuit board 400 and the adhesive layer 300 are separated by a distance in the Y direction, for example, the flexible circuit board 400 and the adhesive layer 300 do not overlap each other in the Z direction.

As shown in FIGS. 4A and 4B, in some embodiments, the adhesive layer 300 and the opening 300A thereof is located between the flexible circuit board 400 (e.g. the end 410 of the flexible circuit board 400) and the first polarizer 210 in the Y direction.

Figure 5:
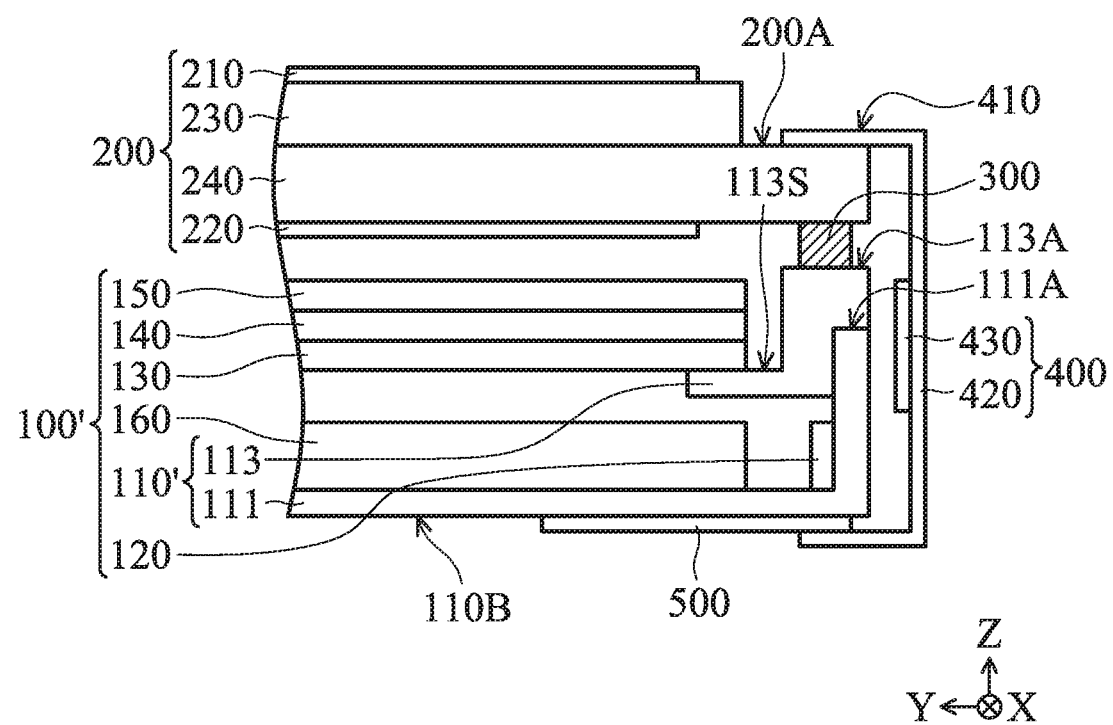
FIG. 5 illustrates a schematic cross-sectional structure view of the electronic device according to some embodiments of the disclosure.

FIG. 5 illustrates a schematic cross-sectional structure view of the electronic device according to some embodiments of the disclosure. In this embodiment, the elements which are the same or similar as those in the previous embodiments are marked with the same or similar numerals as those in the previous embodiments. Please refer to the foregoing for the descriptions of the same or similar elements, and thus, the repeated descriptions of the same or similar elements will be omitted.

As shown in FIG. 5, in some embodiments, the backlight module 100' of the electronic device may include a housing 110' and the aforementioned light-emitting element 120 and optical film 130, the optical film 140 and/or the optical film 150. As shown in FIG. 5, in some embodiments, the housing 110' may include a first housing 111 and a second housing 113. The second housing 113 is disposed on the first housing 111, and the first housing 111 and the second housing 113 are assembled into housing 110'. The light-emitting element 120 is disposed on the first housing 111, the light-emitting element 120 is disposed in an accommodating space formed by the first housing 111. The optical film 130, the optical film 140 and/or the optical film 150 may be disposed on an extending portion 113S of the second housing 113. The optical film 130, the optical film 140 and/or the optical film 150 and the light-emitting element 120 are separated from each other. In some embodiments, the first housing 111 is, for example, a bottom plate, and the second housing 113 is, for example, a middle frame, but not limited thereto.

In some embodiments, as shown in FIG. 5, the adhesive layer 300 is in direct contact with the second housing 113 and the display panel 200. In some embodiments, as shown in FIG. 5, the adhesive layer 300 is not in contact with the first housing 111, and the adhesive layer 300 and the first housing 111 are separated by the second housing 113, however, the adhesive layer 300 overlaps the first housing 111 in the Z direction. In particular, in some embodiments, the adhesive layer 300 is in direct contact with the top surface 113A of the second housing 113 and the display panel 200, and a part of the second housing 113 is disposed on the top surface 111A of the first housing 111. In some embodiments (not shown), the adhesive layer 300 may be partially in contact with the first housing 111, the second housing 113, and the display panel 200, but not limited thereto.

Although embodiments of the present disclosure and advantages thereof have been described above, it should be understood that various changes, substitutions and alterations can be made by those of ordinary skill in the art without departing from the spirit and scope. In addition, the scope of the claims of the present disclosure is not limited to the process, machine, manufacturing, material composition, device, method and steps described in the specific embodiments set forth in the specification, the presently existing or later to be developed process, machine, manufacturing, material composition, device, method and steps which may be readily appreciated from the present disclosure by one of ordinary skill in the art may be utilized according to the present disclosure, as long as the substantially same function could be performed or the substantially same result could be achieved in the embodiments described herein. Accordingly, the scope of the claims of the present disclosure includes the process, machine, manufacturing, material composition, device, method and steps mentioned above. In addition, it could be understood that, with the various implementations listed above, the present disclosure includes various implements. Each claim may constitute an individual embodiment, and the scope of the claims of the present disclosure also includes the combinations of the claims and embodiments. The scope of the present disclosure is subject to the definition of the scope of the appended claims.

What is claimed is:

1. An electronic device, comprising:
   a backlight module;
   a display panel disposed on the backlight module;
   an adhesive layer disposed between the backlight module and the display panel, wherein the adhesive layer includes an opening; and
   a flexible circuit board electrically connected to the display panel, wherein the flexible circuit board overlaps the opening.

2. The electronic device as claimed in claim 1, wherein a width of the opening is from 0.1 mm to 5 mm.

3. The electronic device as claimed in claim 1, wherein a number of the opening overlapped by the flexible circuit board is same as or different from another number of another opening overlapped by another flexible circuit board.

4. The electronic device as claimed in claim 1, wherein the display panel includes a polarizer, the flexible circuit board include a flexible carrier, and the opening is located between the polarizer and the flexible carrier.

5. The electronic device as claimed in claim 1, wherein an end of the flexible circuit board is disposed in a wiring area of the display panel, and the wiring area is located between the opening and the end.

6. The electronic device as claimed in claim 1, further comprising:
   a driving circuit board disposed adjacent to the backlight module, wherein the driving circuit board is electrically connected to the display panel by the flexible circuit board, and the opening is located between the display panel and the driving circuit board.

7. The electronic device as claimed in claim 1, further comprising:
   an insulating buffer layer disposed between a sidewall of the backlight module and the flexible circuit board.

8. The electronic device as claimed in claim 7, wherein the flexible circuit board includes a driving chip, and the insulating buffer layer is in direct contact with the driving chip.

9. The electronic device as claimed in claim 8, wherein the driving chip is electrically isolated from the backlight module by the insulating buffer layer.

10. The electronic device as claimed in claim 1, wherein the adhesive layer includes a UV cured glue layer, a moisture cured glue layer, a double sided glue tape, or any combination thereof.

11. The electronic device as claimed in claim 1, wherein the backlight module comprises:
    a housing; and
    a light-emitting element disposed on the housing;
    wherein the opening is located between the housing and the display panel.

12. The electronic device as claimed in claim 1, wherein the backlight module comprises:
    a first housing and a second housing,
    a light-emitting element disposed on the first housing;
    wherein the second housing is disposed on the first housing.

13. The electronic device as claimed in claim 12, wherein the adhesive layer is in direct contact with the second housing and the display panel.

14. The electronic device as claimed in claim 12, wherein the adhesive layer overlaps the first housing.

15. The electronic device as claimed in claim 1, wherein a wire width of the adhesive layer is in a range from 0.1 mm to 10 mm.

16. The electronic device as claimed in claim 1, wherein a height of the adhesive layer is in a range from 150 μm to 500 μm.

17. The electronic device as claimed in claim 1, wherein a height of the opening is in a range from 150 μm to 500 μm.

18. The electronic device as claimed in claim 1, wherein a height of the adhesive layer and a height of the opening is the same as or different from each other.

19. The electronic device as claimed in claim 1, wherein an end of the flexible circuit board partially overlaps the adhesive layer in the normal direction of the display panel.

* * * * *